United States Patent
Miltat et al.

(10) Patent No.: US 7,630,231 B2
(45) Date of Patent: *Dec. 8, 2009

(54) HYBRID MEMORY CELL FOR SPIN-POLARIZED ELECTRON CURRENT INDUCED SWITCHING AND WRITING/READING PROCESS USING SUCH MEMORY CELL

(75) Inventors: Jacques Miltat, Paris (FR); Yoshinobu Nakatani, Tokyo (JP); Ulrich Klostermann, Munich (DE)

(73) Assignees: Infineon Technologies AG, Neubiberg (DE); Altis Semiconductor S.N.C., Corbeil Essonnes (FR); Centre National de la Recherche Scientifique, Paris (FR); Universite Paris-Sud, Orsay (FR)

( * ) Notice: Subject to any disclaimer, the term of this patent is extended or adjusted under 35 U.S.C. 154(b) by 0 days.

This patent is subject to a terminal disclaimer.

(21) Appl. No.: 11/845,525

(22) Filed: Aug. 27, 2007

(65) Prior Publication Data
US 2008/0094881 A1    Apr. 24, 2008

Related U.S. Application Data

(60) Continuation-in-part of application No. 11/636,616, filed on Dec. 11, 2006, now Pat. No. 7,315,467, which is a continuation of application No. 11/337,667, filed on Jan. 24, 2006, now abandoned, which is a division of application No. 11/024,945, filed on Dec. 30, 2004, now Pat. No. 7,061,797.

(51) Int. Cl.
*G11C 11/00* (2006.01)

(52) U.S. Cl. .................. 365/158; 365/171; 365/173
(58) Field of Classification Search ................ 365/158, 365/171, 173, 225.5, 63, 230.07; 257/295
See application file for complete search history.

(56) References Cited

U.S. PATENT DOCUMENTS

| | | | |
|---|---|---|---|
| 6,269,018 B1 * | 7/2001 | Monsma et al. | 365/145 |
| 6,785,159 B2 | 8/2004 | Tuttle | |
| 6,864,551 B2 | 3/2005 | Tsang | |
| 6,924,520 B2 * | 8/2005 | Park et al. | 257/295 |
| 7,015,555 B2 | 3/2006 | Lee et al. | |

* cited by examiner

*Primary Examiner*—Dang T Nguyen
(74) *Attorney, Agent, or Firm*—Edell, Shapiro & Finnan, LLC

(57) ABSTRACT

A magnetoresistive hybrid memory cell includes first and second stacked structures. The first stacked structure includes a magnetic tunnel junction including first and second magnetic regions stacked in a parallel, overlying relationship separated by a layer of non-magnetic material, wherein the first magnetic region has a fixed first magnetic moment vector and the second magnetic region has a free second magnetic moment vector that is switchable between the same and opposite directions with respect to the fixed first magnetic moment vector. The second stacked structure is at least partly arranged in a lateral relationship with respect to the first stacked structure and includes a third magnetic region having a fixed third magnetic moment vector and the second magnetic region. The first and second structures are arranged between at least two electrodes in electrical contact therewith.

25 Claims, 8 Drawing Sheets

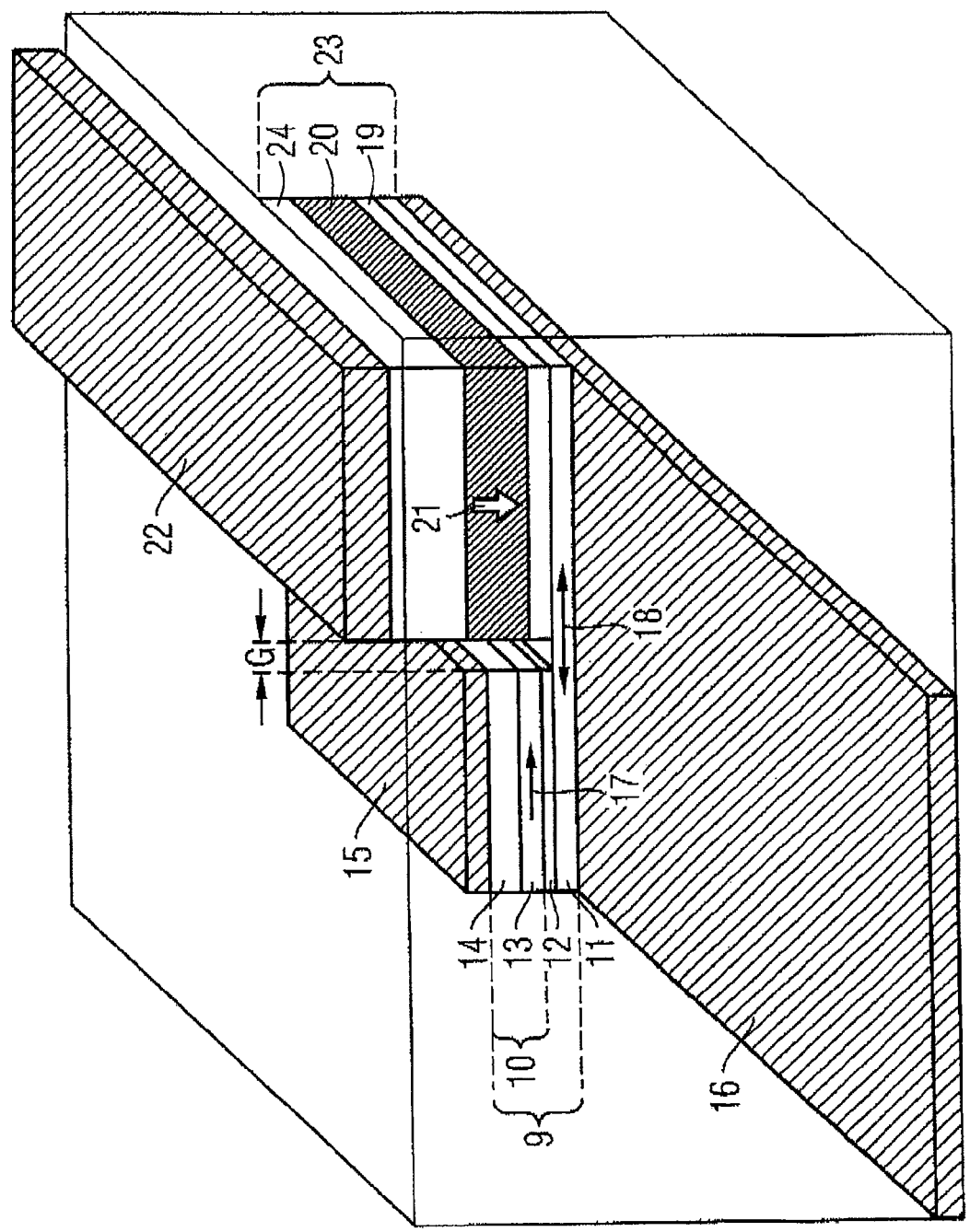

HYBRID MEMORY CELL FOR SPIN-POLARIZED ELECTRON CURRENT INDUCED SWITCHING AND WRITING/READING PROCESS USING SUCH MEMORY CELL

CROSS-REFERENCE TO RELATED APPLICATIONS

This application is a continuation-in-part of U.S. patent application Ser. No. 11/636,616 filed on Dec. 11, 2006, which in turn is a continuation of U.S. patent application Ser. No. 11/337,667 filed Jan. 24, 2006, now abandoned, which in turn is a divisional of U.S. patent application Ser. No. 11/024,945, filed Dec. 30, 2004, now U.S. Pat. No. 7,061,797, each entitled "Hybrid Memory Cell for Spin-Polarized Electron Current Induced Switching and Writing/Reading Process Using Such Memory Cell." The entire contents of these applications are hereby incorporated by reference.

BACKGROUND

Magnetic (or magnetoresistive) random access memory (MRAM) is a non-volatile memory technology considered to be of great future importance as the standard memory technology for computing devices.

A schematic representation of a typical magnetoresistive memory cell is shown in FIG. 1. A magnetoresistive memory cell (also referred to as a tunneling magneto-resistive or TMR-device) includes a structure having ferromagnetic layers 2, 4 respectively having a resultant magnetic moment vector 5, 6 separated by a non-magnetic layer (tunnel barrier) 3 and arranged into a magnetic tunnel junction (MTJ) 1. Digital information is stored and represented in the magnetic memory cell as directions of magnetic moment vectors in the ferromagnetic layers. More specifically, the resultant magnetic moment vector 6 of one ferromagnetic layer 4 is magnetically fixed or pinned (typically also referred to as the "reference layer", "pinned layer" or "fixed layer"), while the resultant magnetic moment vector 5 of the other ferromagnetic layer 2 (typically also referred to as the "free layer") is free to be switched between two preferred directions, i.e., the same and opposite directions with respect to the fixed magnetization 6 of the reference layer 4. The orientations of the magnetic moment vector 5 of the free layer 2 are also known as "parallel" and "antiparallel" states, respectively, wherein a parallel state refers to the same magnetic alignment of the free and reference layers (upper diagram of FIG. 1), while an antiparallel state refers to opposing alignments therebetween (lower diagram of FIG. 1). Accordingly, a logic state of a magnetoresistive memory cell is not maintained by power as in DRAMs, but rather by the direction of the magnetic moment vector of the free layer with respect to the direction of the magnetic moment vector of the reference layer (for instance, a logic "0" in the case of a parallel alignment of magnetic moment vectors and a logic "1" in the case of an antiparallel alignment therebetween).

Depending upon the magnetic states of the free layer, the magnetic memory cell exhibits two different resistance values in response to a voltage applied across the magnetic tunnel junction barrier, wherein the resistance is "low" when the magnetization is parallel and "high" when the magnetization is antiparallel, so that a detection of changes in resistance allows an MRAM-device to provide logic information stored in the magnetic memory element.

A magnetic memory cell typically is written to through the application of magnetic fields from bi- or uni-directional currents. For writing of magnetic memory cells different writing (switching) scenarios are known depending on the actual configuration of the magnetoresistive memory cell such as Stoner-Wohlfahrt-switching or adiabatic rotational switching (toggle-switching) which are well-known to those skilled in the art and therefore need not be further detailed here.

To be useful in present day electronic devices, such as digital cameras or the like, very high density arrays of magnetic memory cells must be used, thus rendering a scaling-down of MRAM cells one of the most important issues, which, however, requires several problems to be solved.

Down-scaling of MRAM cells requires smaller and smaller magnetic tunnel junctions, which proves problematic, since for a given aspect ratio and free layer thickness, the activation energy, being dependent on the free layer volume, scales down like w, where w is the width of the magnetic cell. Otherwise, in down-scaling, the switching fields increase roughly like $1/\sqrt{w}$, so that magnetic field selected switching becomes ever harder, but at the same time the magnetic cells loose their information more and more rapidly due to thermal activation. A major problem with having a small activation energy (energy barrier) is that it becomes extremely difficult to selectively switch one MRAM cell in an array, where selectability is seen to allow switching without inadvertently switching other MRAM cells. The memory cells therefore still need to retain a sizeable shape or induced anisotropy in order to maintain thermal stability.

Reference is now made to FIG. 2 showing a diagram in which the energy barrier height $\Delta E$ for switching of magnetic moment vector 5 of magnetic free layer 2 of rectangular MTJ 1 of FIG. 1 having lateral dimensions L for length and l for width (see insert) and a low thickness of about 2 nm is plotted against its width l. It is further assumed that magnetization of the magnetic free layer 2 is aligned along directions $\pm x$. Considering a simple Arrhenius law with a 0.1 nsec characteristic attempt time, requesting a ten years stability is equivalent to setting the barrier height between stable states ($-x$ and $-x$) at about 45 $k_B T$ (T=300° K., room temperature, $k_B$ is Boltzmann constant).

As can be seen from FIG. 2, an aspect ratio L/l=2 proves sufficient for overcoming the energy barrier height lower limit criterion if l remains greater than about 60 nm. A slight increase of the aspect ratio pushes the limit further out. It also becomes clear that as sizes shrink down, the superparamagnetic limit becomes closer and closer.

Another problem in scaling down magnetoresistive memory cells may be seen in that in the case of magnetic field selected switching of memory cells the cell sizes need to be smaller than sizes of the current lines for generating of magnetic fields in order to ensure essentially homogeneous magnetic fields over the whole memory cell area.

In an attempt to overcome the above problems, a new concept of writing to magnetoresistive memory cells has been recently proposed, where the reversal of the magnetic moment vector of the magnetic free layer is generated not by external magnetic fields but by spin-polarized electrons passing perpendicularly through the stack of memory cell layers. For a detailed description of that concept, see for instance seminal U.S. Pat. No. 5,695,864 to Slonczewski and U.S. Pat. No. 6,532,164 to Redon et al., the disclosures of which are incorporated herein by reference.

In the above new concept, by sending an electric current through a magnetic layer having a particular magnetization, spins of electrons are oriented by quantum-mechanical magnetic exchange interaction with the result that the current electrons leave the magnetic layer with a polarized spin. Alternatively, where spin-polarized electrons are passed through a magnetic layer having a particular magnetic moment vector in a preferred easy axis direction, these spin-polarized electrons will cause a continuous rotation of the magnetic moment vector which may result in a reversal of the magnetic moment vector along its easy axis. Hence, switching of the magnetic moment vector between its two preferred directions along the easy axis may be effected by passing spin-polarized electrons perpendicularly through the magnetic layer.

Recent experimental data (see S. I. Kiselev et al., Nature 425 (2003), 380 and W. H. Rippard et al., Phys. Rev. Lett. 92 (2004) 027201) confirm the very essence of magnetic moment transfer as a source of magnetic excitations and, subsequently, switching. These experiments confirm theoretical predictions (see J. C. Sloncezwski, J. Magn. Magn. Mater. 159 (1996) L1 and M. D. Stiles & A. Zangwill, Phys. Rev. B66, (2002) 014407) stating that the leading torque term acting on the magnetization under conditions of spin-polarized DC current is proportional to:

$$\frac{dm}{dt} \propto P[m \times (m \times p)]$$

where: m, p and P are the magnetization direction in space, the polarization direction of the electron current (density per unit area J) and a polarization function, respectively. A direct inspection of above equation indicates that the torque will be maximized when p is orthogonal to m.

In one embodiment the anisotropy of free layer is in-plane with respect to the film plane (FIG. 3A).

In another embodiment, the anisotropy direction of the free layer is perpendicular to the film plane (FIG. 3B)

Reference is now made to FIGS. 3A to 3C, where a schematic representation of both a magnetic free layer 2 and a magnetic layer 7 for spin-polarizing of current electrons in a stacked arrangement is shown. In that configuration, the magnetic free layer 2 is provided with a magnetization easy axis where a magnetic moment vector 5 is free to be switched between two preferred directions thereof. Magnetic layer 7 is provided with a fixed magnetic moment vector 8 being perpendicular (FIG. 3A) to the magnetic moment vector 5 or parallel (FIG. 3B) to the magnetic moment vector 5. FIGS. 3A and 3B illustrate a case where a current density J of an electron current (not illustrated) flowing perpendicularly through the layers is assumed to be nil, while in FIG. 3C the current density J is assumed to be different from zero. Accordingly, on the one hand, in FIGS. 3A and 3B where no current is passing through the layers, magnetic moment vector 5 remains unchanged, while, on the other hand, in FIG. 3C, electrons passing through the layers are spin-polarized when flowing through magnetic layer 7 by the effect of magnetic exchange interaction. If a polarization direction p of the current electrons belongs to the plane of the magnetic free layer 2, then rotation of the magnetic moment vector 5 occurs in the plane of magnetic free layer 2 and the torque becomes nil when m becomes parallel to p (that case is shown in FIG. 3B). Alternatively, if p is perpendicular to the plane of the magnetic free layer 2 (case shown in FIGS. 1A, 1B), then the initial torque pulls the magnetic moment vector 5 out of its plane, thus creating a demagnetizing field $H_D$ perpendicular to the magnetic free layer 2 plane, with the result that a precession movement of the magnetic moment vector 5 around the demagnetizing field $H_D$ may now take place.

In other words, in a magnetic element such as the soft element of an MRAM cell, the magnetization direction though not far from being uniform fails to be so as a result of demagnetizing effects. Coherence during magnetic switching may nevertheless be preserved if the field exerting a torque on the magnetization is perpendicular to the soft layer. In order to achieve this, the best strategy is to apply a magnetic field normal to the mean magnetization direction within the soft element and in the plane of the layer. The initial torque $\gamma_0[m \times H_a]$, where $\gamma_0$, m, $H_a$ are a gyromagnetic ratio, magnetization vector and applied magnetic field, respectively, pulls the magnetization out of the plane leading to the growth of a demagnetizing field that remains essentially normal to the plane of the layer. The magnetization may now precess around the demagnetizing field under the torque $\gamma_0[m \times H_D]$, where $H_D$ is the demagnetizing field.

In order to observe precessional switching, three conditions have to be fulfilled, namely, both the rise and fall times of the field pulse need to be "short" and the length of the pulse has to be tailored very accurately, where "short" means a time small when compared to time requested for the magnetization to make half a turn. Let T and f be the period and precession frequency, respectively. A half a turn rotation means a time equal to T/2. One has T=1/f and f depends on the amplitude of the demagnetizing field: $\omega=2\Pi f=\gamma_0 H_d$. On the other hand, the demagnetizing field scales with the angle of the magnetization out of the sample plane.

An example may illustrate this: suppose the magnetization leaves its plane by an angle of $\theta=10°$, then the demagnetizing field amplitude will amount to about $H_d \approx M_s \sin(10°)$. For a typical soft material with saturation induction $\mu_0 M_s=1$ Tesla, this means a precession frequency equal to $f=(\omega/2\Pi)=\gamma_0 M_s \sin(10°) \approx 5$ GHz. The period then amounts to 200 picoseconds, and the time necessary for a half turn rotation would typically be $T/2=100 \times 10^{-12}$ sec (100 picoseconds (ps)). In summary, owing to values chosen in the sample, the pulse length should be close to 100 ps and the fall and rise times much shorter than 100 ps. Laboratory realizations allow for pulse rise and fall times of the order of 20 ps.

Precessional switching is a very robust and fundamental effect. In a large scale memory, however, due to various sources of impedance, it is expected that maintaining such accuracy in the definition of the field pulses might prove extremely problematic.

In order to result in a desired reversal of the free magnetic moment vector, precession movement has to be controlled appropriately, which, however, has not been demonstrated in prior art.

SUMMARY

Non-volatile semiconductor memory chips and more particularly magnetoresistive memory cells adapted for spin-polarized electron current induced switching are described herein. A magnetoresistive hybrid memory cell includes first and second stacked structures. The first stacked structure includes a magnetic tunnel junction including first and second magnetic regions stacked in a parallel, overlying relationship separated by a layer of non-magnetic material, wherein the first magnetic region has a fixed first magnetic moment vector and the second magnetic region has a free second magnetic moment vector that is switchable between the same and opposite directions with respect to the fixed first magnetic moment vector. The second stacked structure is at least partly arranged in a lateral relationship with respect to the first stacked structure and includes a third magnetic region having a fixed third magnetic moment vector and the second magnetic region.

The first and second structures are arranged between at least two electrodes in electrical contact therewith.

The above and still further features and advantages of the present invention will become apparent upon consideration of the following definitions, descriptions and descriptive figures of specific embodiments thereof, wherein like reference numerals in the various figures are utilized to designate like components. While these descriptions go into specific details of the invention, it should be understood that variations may and do exist and would be apparent to those skilled in the art based on the descriptions herein.

BRIEF DESCRIPTION OF THE DRAWINGS

The accompanying drawings, which are incorporated in and constitute a part of the specification, illustrate presently preferred embodiments of the invention, and together with the general description given above and the detailed description given below, serve to explain the principles of the invention.

FIGS. 3A to 3C illustrate a stacked structure comprised of a magnetic layer having fixed magnetization and a magnetic free layer having a free magnetization free to be rotated with respect to the fixed magnetization due to spin-polarized electron current flowing there through;

FIGS. 4A to 4C show a schematic representation of an embodiment of a hybrid magnetoresistive memory cell of the invention;

DETAILED DESCRIPTION

Figure 1:
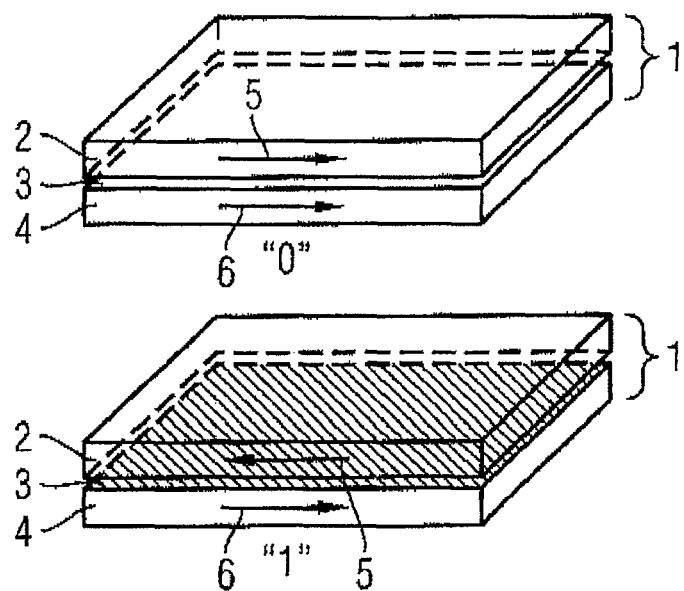
FIG. 1 is an exemplary schematic representation of a typical magnetic tunnel junction included in an MRAM cell.

In light of the above, the invention provides a magnetoresistive memory cell allowing a further cell size down-scale without causing severe problems as to an increase of switching-fields and decrease of activation energy.

The invention further provides a method of writing to (switching) and reading of resistance states of above magnetoresistive memory cells.

According to a first aspect of the invention, a magnetoresistive hybrid memory cell comprises a first stacked structure being provided with a magnetic tunnel junction including first and second magnetic regions which are stacked in a parallel, overlying relationship and are separated by a layer of non-magnetic material. The first magnetic region is provided with a fixed first magnetic moment vector, while the second magnetic region is provided with a free second magnetic moment vector which is free to be switched between the same and opposite directions with respect to above fixed first magnetic moment vector of the first magnetic region. The magnetoresistive hybrid memory cell further comprises a second stacked structure which at least partly is arranged in a lateral relationship as to the first stacked structure and comprises both a third magnetic region and the second magnetic region, the latter one thus being a common magnetic region of both first and second stacked structures. The third magnetic region is provided with a fixed third magnetic moment vector, which typically and preferably is aligned in an orthogonal direction as to the free second magnetic moment vector of the second magnetic region. Furthermore, the first and second structures are arranged in between at least two electrodes in electrical contact therewith.

Magnetic anisotropy of the second magnetic region may be due to shape anisotropy and/or intrinsic anisotropy. In the former case, the second magnetic region may, for instance, be elliptic in shape.

In a particularly preferred embodiment of the first aspect of the invention, one of above-cited electrodes for contacting the first and second structures being arranged on one side of the first and second structures is a common electrode in electrical contact with both first and second stacked structure. Such common electrode is preferably positioned adjacent the second magnetic region, in particular in direct electrical contact therewith.

In another particularly preferred embodiment which preferably may be combined with a common electrode connecting the first and second structures on the one side, separate electrodes for each one of the first and second structures are provided on the other side of the first and second structures. Such particular design allows for an advantageous decoupling of write and read functions, which, hence, can be optimized independently.

Alternatively, it is also possible to envisage separate electrodes for each one of the first and second structures which are provided on both sides of them.

According to a second aspect of the invention, a method of writing to and reading of a magnetoresistive hybrid memory cell is given, which comprises the following steps: providing of a magnetoresistive hybrid memory cell as above-described with regard to the first aspect of the invention; applying of a writing voltage pulse to electrodes on both sides of only the second structure (and not the first structure) resulting in a current pulse flowing through the second magnetic region for writing of the free second magnetic moment vector; applying of a reading voltage pulse to electrodes on both sides of only the first structure (and not the second structure) resulting in a current pulse flowing through the magnetic tunnel junction. Accordingly, applying writing and reading voltage pulses to second and first stacked structures, respectively, allows for an advantageous decoupling of writing and reading functions.

In a mostly preferred embodiment of the second aspect of the invention, a switching voltage pulse is applied which is adapted to result in a coherent rotation over half a full turn of the free second magnetic moment vector in total. Such coherent rotation over half a full turn of the free second magnetic moment vector may preferably be achieved in applying writing voltage pulses having a slow rise time and a fast fall time. The terms "slow" and "fast", here, have a meaning exactly analogous to the precessional switching case described in the introductory portion, that is, "fast" means times shorter than a half precession cycle, while "slow" means times substantially larger than a full precession cycle. Hence, precessional switching requires both "fast" field pulse rise and fall times, whereas spin injection in the present geometry requires "slow" current rise times. This is a result of extended numerical simulation work done by the inventors. A "fast" current rise time would lead to a lot of unwanted magnetization "ringing" (response oscillations).

As also explained in the introductory portion with respect to the precessional switching case, "coherent rotation" means that, irrespective of the magnetization distribution (not a perfectly uniform distribution), the torque acts in such a way that all moments are subjected to a torque acting in the same direction, thus maintaining coherence of the distribution. This is not at all the case for the conventional spin injection cells for which by different simulations markedly chaotic behaviors have been predicted. Other and further objects, features and advantages of the invention will appear more fully from the following description.

Figure 4B:
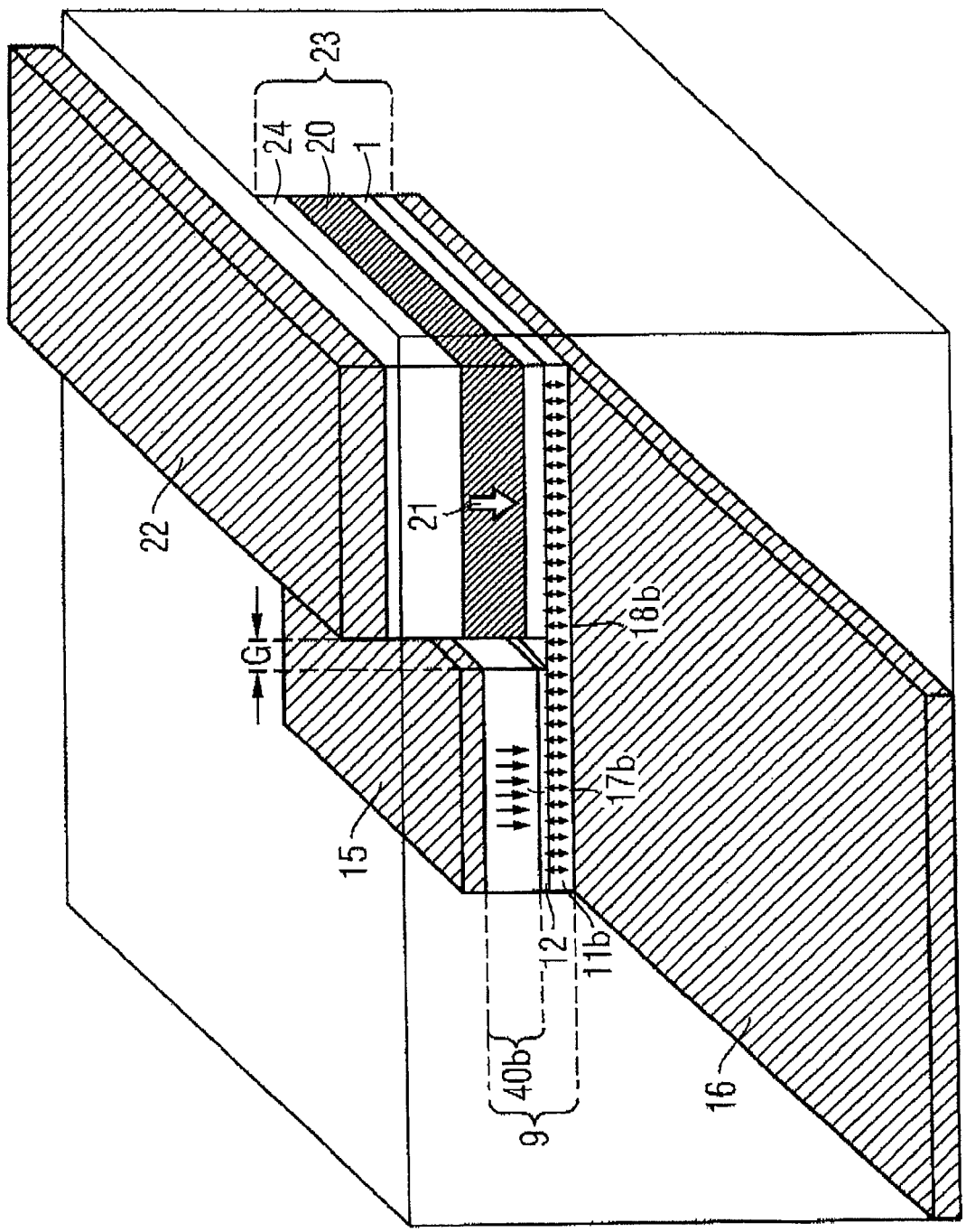
Figure 4C:
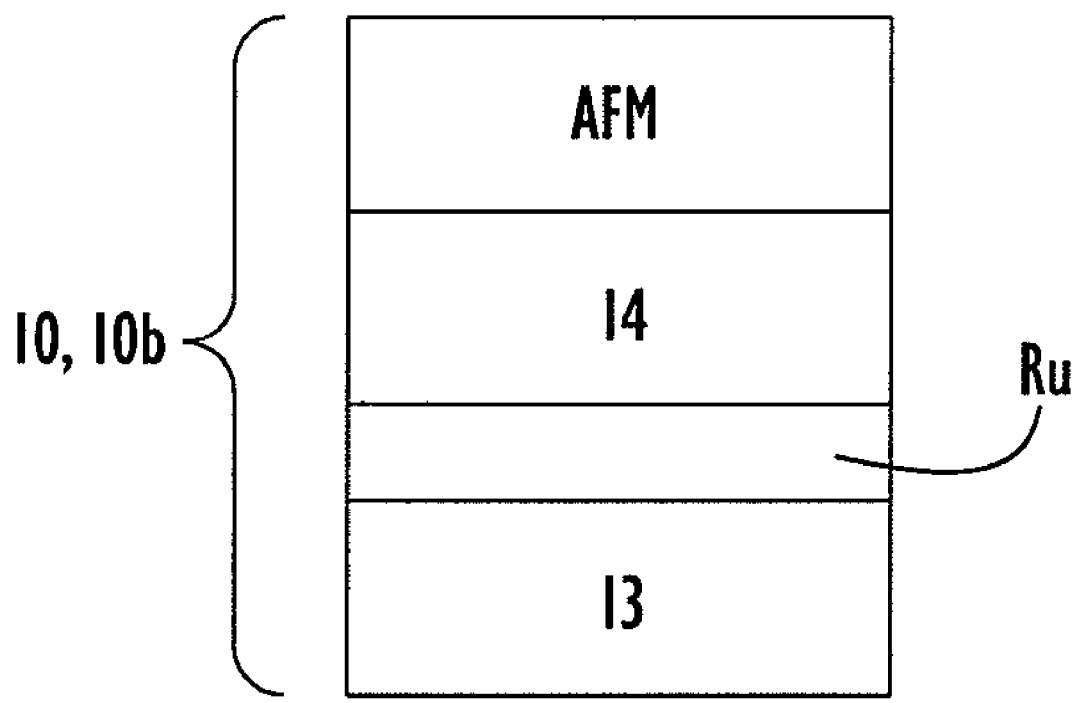

Embodiments of the present invention will be described in detail below with reference to the accompanying drawings. Referring to FIGS. 4A to 4C, embodiments of the hybrid memory cell of the invention are explained. Based on a conventional magnetic memory cell, the hybrid magnetic memory cell of the invention comprises a first stacked structure 9 being comprised of a magnetic tunnel junction (MTJ) which includes a fixed first magnetic region 10, 10b and a free second magnetic region 11, 11b stacked in a parallel, overlying relationship and separated by a tunneling barrier layer 12. Magnetic free region 11,11b is made of a magnetic material such as CoFe/NiFe, Ni, Co, Ni/Co and is provided with a free second magnetic moment vector 18, 18b free to be switched between oppositely aligned orientations along its magnetic easy axis. In the embodiment of FIG. 4A the second magnetic moment vector 18 is oriented parallel to the plane of the layer 13, whereas in the embodiment of FIG. 4B in the second magnetic moment vector 18b has a perpendicular magnetization direction, i.e., a direction perpendicular to the plane of the layer 13. Magnetic reference region 10, 10b comprises two layers 13, 14 of ferromagnetic materials such as Co, CoFe with its magnetizations being antiferromagnetically coupled resulting in a fixed first magnetic moment vector 17, 17b. As shown in FIG. 4C these two layers 13, 14 are separated by a thin coupling layer made of, for example, ruthenium (Ru) in order to achieve an antiferromagnetic coupling between layers 13, 14 as well known in the art. Further, the ferromagnetic layer 13 or 14 might be additionally coupled to a natural antiferromagnet AFM (e.g., made of IrMn, PtMn, etc.) in order to increase the reference layer stability as also well known from prior art. Intermediate layer 12 is made of a nonmagnetic material such as $AlO_x$. The hybrid memory cell of the invention further comprises a second stacked structure 23 which includes the free second magnetic region 11, 11b, a third magnetic region 20 having a fixed third magnetic moment vector 21 which is perpendicularly directed to the second magnetic moment vector 18 (FIG. 4A) or parallel to the second magnetic moment vector 18b (FIG. 4B), a conductive layer 24 for instance made of Au and being arranged on top of third magnetic region 20 in contact therewith, and a further conductive layer 19 for instance made of Cu and being arranged beneath third magnetic region 20 in contact therewith. Above second magnetic region 11, first and second stacked structures 9 and 23, respectively, are arranged in a lateral relationship leaving an intermediate gap G between them. Further, first and second stacked structures are arranged between a common bottom electrode 16 connecting both first and second structures and separate top electrodes 15, 22, that is to say a separate top electrode for each one of stacked structures.

The configurations of free layer 11, 11b and reference layers 10, 10b and 20 can also be fabricated right side up, with the free layer 11, 11b being on top of the reference system for read and write.

Having separate top electrodes 15, 22 for each one of both first and second stacked structures, hybrid magnetoresistive memory cells of FIG. 4A, 4B enable a desirable decoupling of write and read functions.

Further characteristics of the invention are now explained. Let's call F the minimum feature size (smallest dimension) of the technology used, e.g., 0.11 μm, 90 nm, 65 nm following the semiconductor roadmap. A magnetic memory cell today may barely be smaller than 2 $F^2$ due to the necessity for maintaining some kind of shape anisotropy (toggle switching, however, allows for circular elements). As mentioned above within the context of field addressing, the field necessary to commute cells grows with decreasing cell size. In contrast, the smaller the active region of spin-injection, the smaller the detrimental effect due to the field created by the requested current density (the so-called Oersted field). It is well known that, for usual 3d ferromagnetic materials, spin-injection ceases to be relevant for cell sizes exceeding some 100 nm.

In the proposed scheme, the minimal cell size is 3 $F^2$. This means that the distance G in FIGS. 4A, 4B may not be smaller than F due to processing constraints. On the other hand, allowing for a 1$F^2$ area for the spin-injection region (the right part of FIG. 4A, 4B) is extremely favorable, because it complies with the necessity to decrease as much as possible the Oersted field. The present scheme mimics through spin-injection a precessional type motion of the magnetization in the spin-injection region. It is a fundamental process due to the relative orientations of the magnetization 21 in layer 20 and magnetization 18, 18b in layer 11.

Once the magnetization 18, 18b in layer 11, 11b has been reversed under layer 20, a wall is created, which has inertia, so that once it is set into motion, it will continue moving for some time that is mainly controlled by the damping in the material. As simulations by the inventors have shown, this "wall launching" mechanism allows for wall motion through out the extent of the cell layer 11, 11b. Additionally, some current flowing from layer 22 into sublayer 16 will also flow along the full length of the cell layer 11, 11b. Because it's flowing in a ferromagnetic material, such a current is spin-polarized and exerts a pressure on the wall, thus assisting wall motion. This last effect is, however, hard to quantify, because it depends crucially on the difference in electrical resistivity between layers 11, 11b and 16. This last effect has been neglected by the simulations made by the inventors.

It should be noted that in the perpendicular configured system of FIG. 4B the switching of the layer 11b can be achieved by bi-directional currents.

Using cell design for spin injection suffers from the drawback of needing to simultaneously optimize both the writing current and the read signal. Giant magnetoresistance structures would exhibit weak read signals. Moreover, the signal decreases with decreasing cell size. Tunnel junctions do not suffer from this basic drawback, but the mechanisms that eventually allow cell switching through very shallow tunnel junctions remain unclear. Shallow tunnel junctions result in smaller read signals. From an engineering viewpoint, the larger the read signal, the better.

Figure 2:
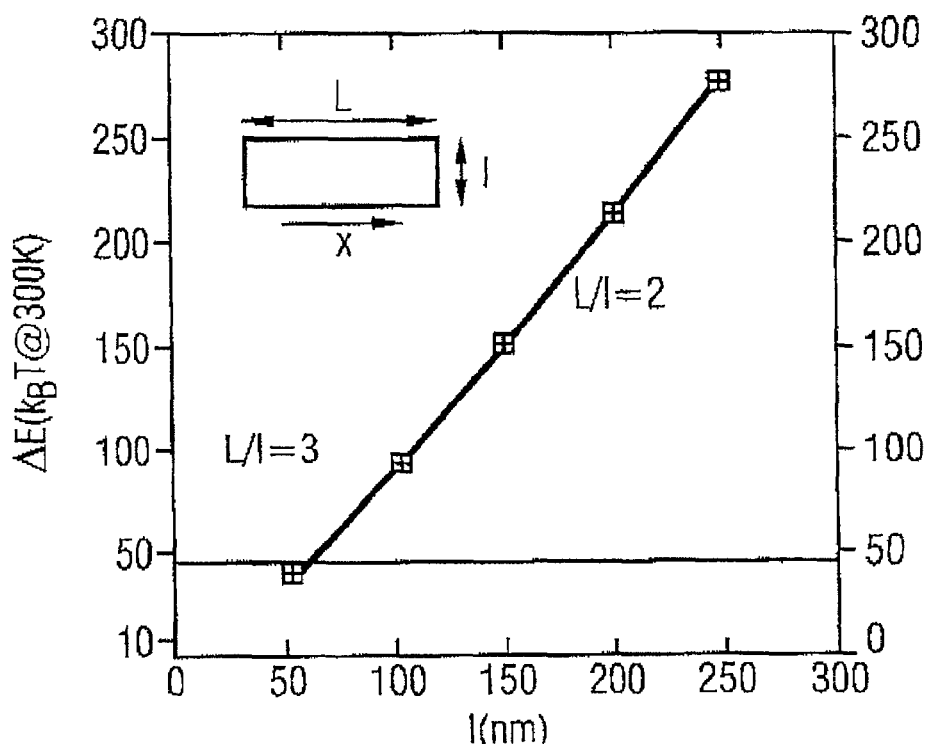
FIG. 2 shows a diagram illustrating energy barrier height for switching of an MRAM cell versus width dimension 1.

In the proposed scheme, thermal stability is improved through the geometry: a 3 $F^2$ cell size remains thermally stable over a long term for the smallest F dimensions because of the aspect ratio, as shown in FIG. 2 (F is 1 in FIG. 2). Additionally, the magnetostatic coupling between layer 20 with magnetization 21 and layer 11 with magnetization 18 will contribute to an increased thermal stability.

As stated above, in the proposed scheme, write and read functions may be independently optimized, where optimization means here both optimization of the read signal (state of the art tunnel junction 9 in the low current regime, and the best materials between layers 11 and 13), and optimization of the write current (optimized spin-polarization through the choice of materials in layers 11 and 20, and optimized spin-accumulation through a proper choice of the thicknesses of layers 21, 20 and 19).

Figure 5:
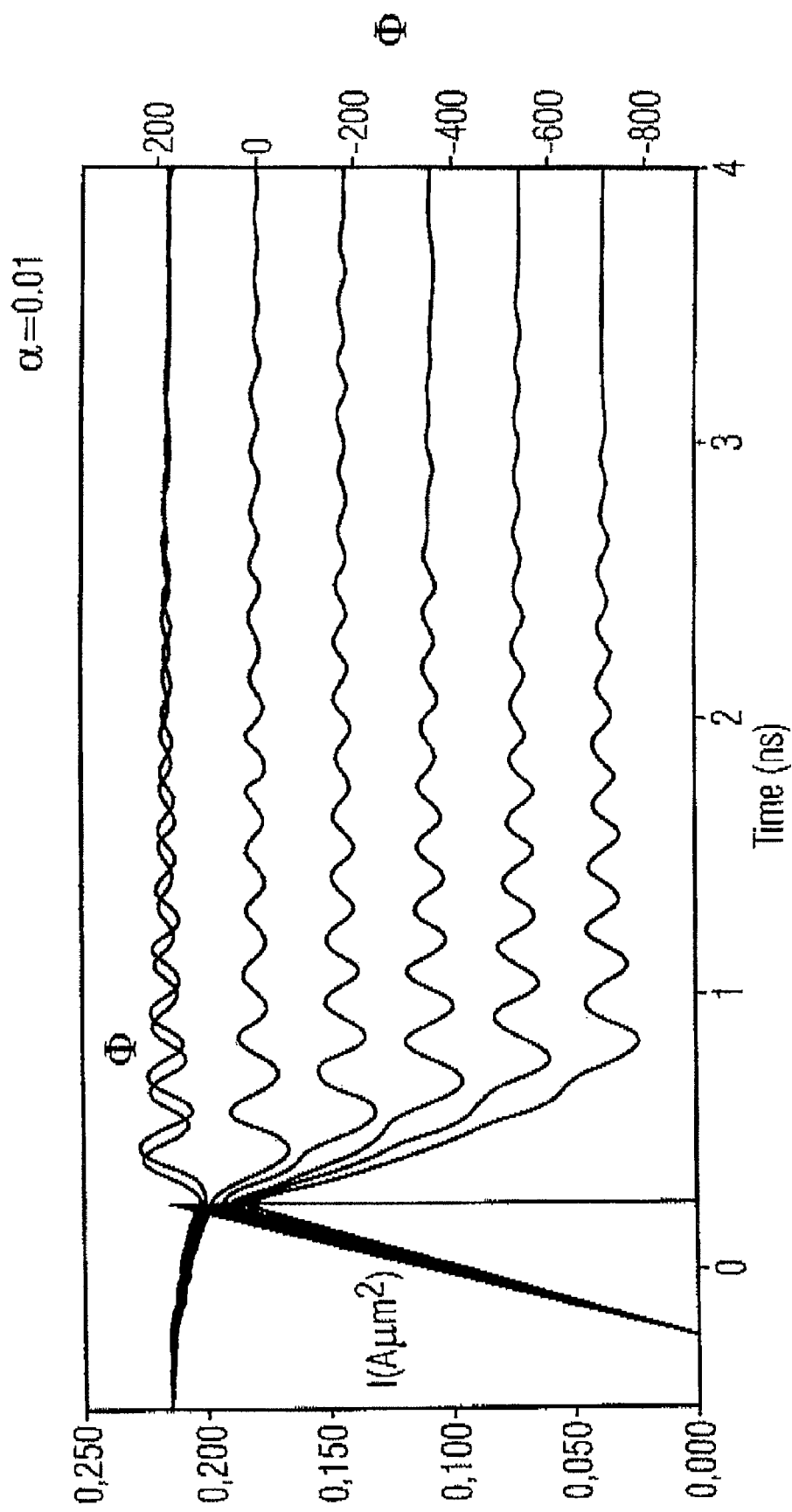
FIG. 5 shows a diagram illustrating writing current I in the single spin limit versus time.

Now referring to FIGS. 5-7, a numeric simulation concerning the method of writing to a magnetoresistive hybrid memory cell is explained.

As can be seen from FIG. 5, a numeric simulation in the single spin limit reveals that controlled precession of the free second magnetic moment vector may be achieved through the application of current pulses with a slow rise time and a fast fall time.

Figure 3A:
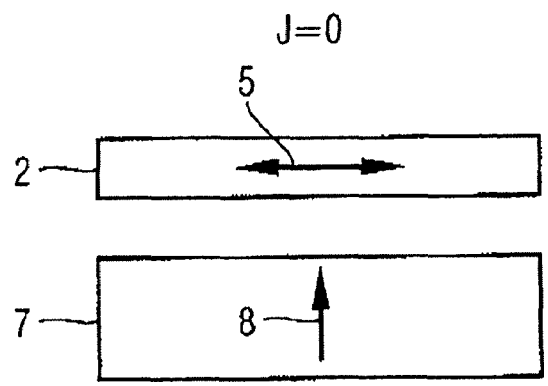
Figure 3B:
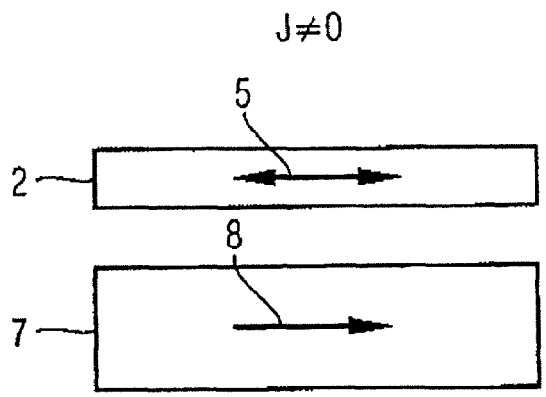
Figure 3C:
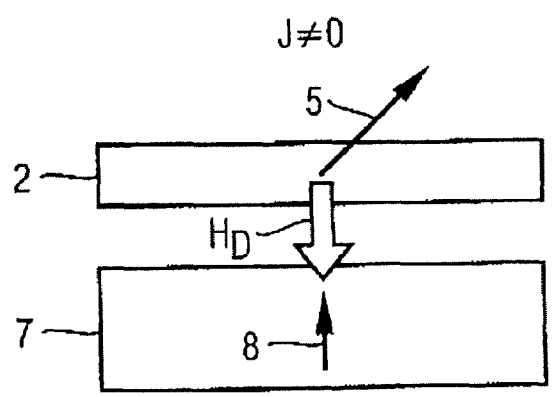

FIG. 5 (single spin type simulations) further shows that, for asymmetrical current pulses, a proper choice of the current density allows for a controlled magnetization rotation. Φ(in °) to the right of the figure is seen to move in steps of 180°, meaning one half a turn, a full turn, three half-a-turn etc. The figure applies to the case of FIG. 3C, not to FIG. 4A, 4B. This was an initial step to illustrate that control was solely possible if allowing for pulse asymmetry.

Figure 6A:
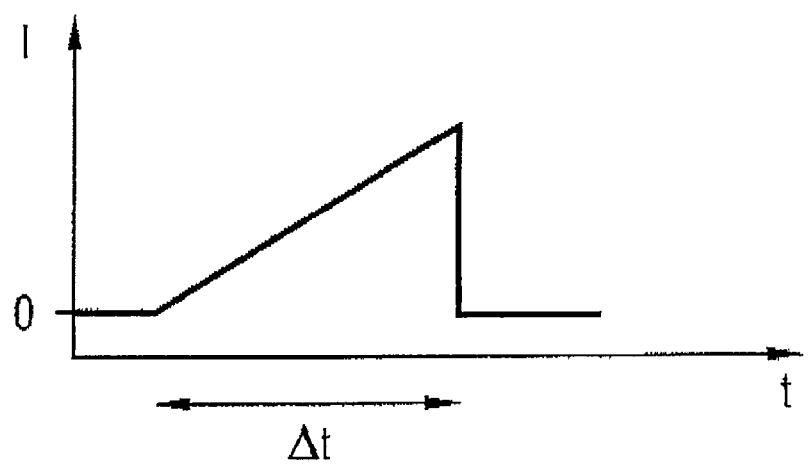
FIGS. 6A and 6B show a typical writing current pulse having slow rise and fast decay times resulting in a typical sawtooth profile (FIG. 6A) and curve illustrating writing current versus pulse length resulting in single reversal events.
Figure 6B:
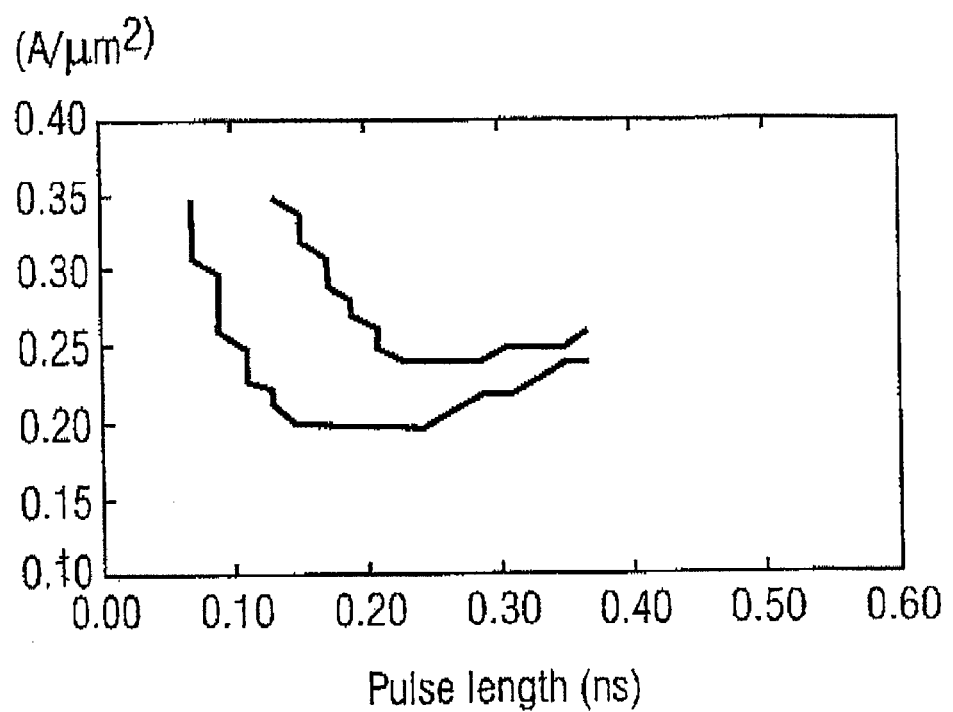

An extension of such calculations to the micromagnetic regime confirms this prediction, as can be seen from FIGS. 6A and 6B. Current injection through half of the platelet area yields the following results, which are given in FIGS. 7A and 7B.

Figure 7A:
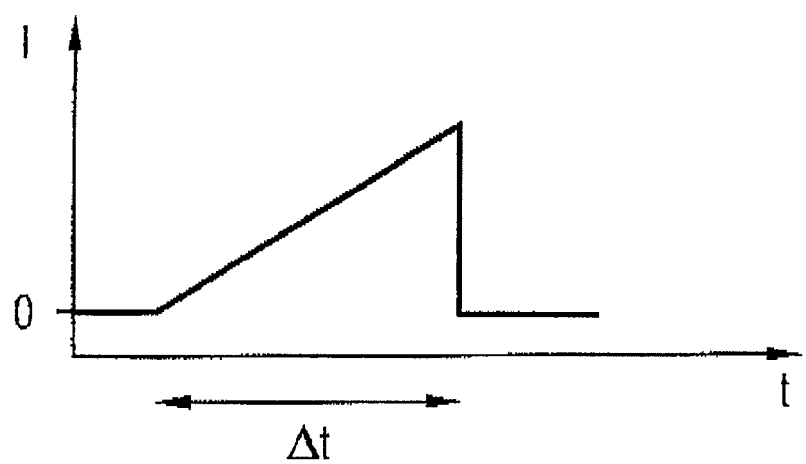
FIGS. 7A and 7B show diagrams analogous to FIGS. 6A and 6B in the case of a limitation to the half of the platelet area.
Figure 7B:
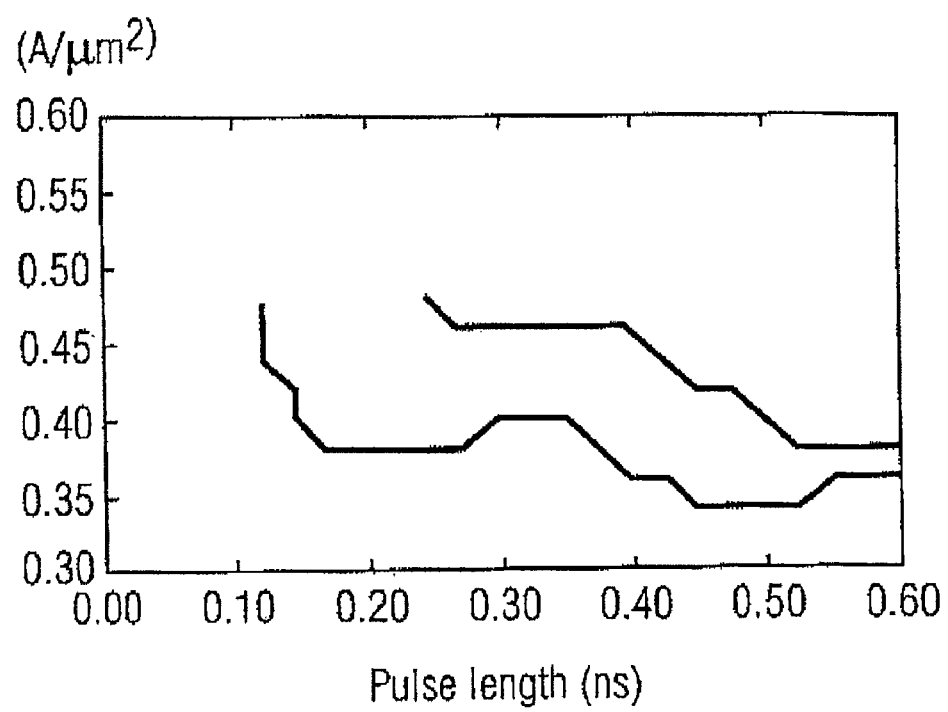

FIGS. 6B and 7B are computed operational margins as determined by full micromagnetic simulations (meaning that now the detailed aspects of the magnetization distribution both in space and time are taken into account) in a parameter space where the horizontal scale is the pulse length as defined in FIGS. 6A and 7A, respectively, and the vertical scale the current density at the end of the pulse.

FIGS. 6A and 6B concern current densities that are homogeneous through the entire cell and are therefore not directly usable for the present invention. In contrast, FIGS. 7A and 7B apply to cells where the current flows in only half of a 2 $F^2$ cell, i.e., a cell, where distance G in FIG. 4 would be ideally zero. FIGS. 7A and 7B show that a fairly sizeable operational margin may be expected with pulse durations in the 0.15 to 0.45 ns (150 to 450 ps) and maximum current densities in 0.4 to close to 0.475 A/$\mu$m$^2$. Constraints on pulse durations are expected to be rather weak. Current densities are more challenging, as the margin does not exceed some 15%, according to extended and state of the art numerical simulations.

Many modifications and variations of the present invention are possible in light of the above description. It is therefore to be understood, that within the scope of appended claims, the invention may be practiced otherwise than as specifically devised.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

What is claimed is:

1. A magnetoresistive hybrid memory cell, comprising:
a first stacked structure comprising a magnetic tunnel junction including first and second magnetic regions stacked in a parallel, overlying relationship separated by a layer of non-magnetic material, wherein the first magnetic region has a fixed first magnetic moment vector and the second magnetic region has a free second magnetic moment vector which is switchable between a same and opposite directions with respect to the fixed first magnetic moment vector of the first magnetic region;

a second stacked structure arranged at least partly in a lateral relationship to the first stacked structure and comprising a third magnetic region having a fixed third magnetic moment vector and the second magnetic region; and at least two electrodes, wherein the first and second structures are arranged between, and are in electrical contact with, the at least two electrodes, wherein the first magnetic moment vector of the first magnetic region is aligned parallel with respect to the second magnetic moment vector of the second magnetic region.

2. The magnetoresistive hybrid memory cell of claim 1, wherein the fixed third magnetic moment vector of the third magnetic region is aligned parallel with respect to the free second magnetic moment vector of the second magnetic region.

3. The magnetoresistive hybrid memory cell of claim 2, wherein the first, second and third magnetic moment vectors are perpendicularly aligned with respect to a bottom surface of the first and second stacked structures.

4. The magnetoresistive hybrid memory cell of claim 1, wherein one of the at least two electrodes is arranged on one side of the first and second stacked structures and is a common electrode connecting the first and second stacked structures.

5. The magnetoresistive hybrid memory cell of claim 4, wherein the common electrode is positioned adjacent the second magnetic region.

6. The magnetoresistive hybrid memory cell of claim 5, wherein the at least two electrodes includes separate electrodes for each of the first and second stacked structures, the separate electrodes being respectively arranged on the first and second stacked structures on a side opposite the common electrode.

7. The magnetoresistive hybrid memory cell of claim 1, wherein the at least two electrodes includes first and second electrodes on opposite sides of the first stacked structure, and third and fourth electrodes on opposite sides of the second stacked structure, the third and fourth electrodes being separate from the first and second electrodes.

8. The magnetoresistive hybrid memory cell of claim 1, wherein the first magnetic region comprises: a first ferromagnetic layer, a separating layer, a second ferromagnetic layer and an antiferromagnetic layer.

9. The magnetoresistive hybrid memory cell of claim 8, wherein the separating layer comprises ruthenium (Ru).

10. A method of writing to and reading from a magnetoresistive hybrid memory cell, the method comprising:
providing a magnetoresistive hybrid memory cell comprising:
a first stacked structure comprising a magnetic tunnel junction including first and second magnetic regions stacked in a parallel, overlying relationship separated by a layer of non-magnetic material, wherein the first magnetic region being provided with a fixed first magnetic moment vector and the second magnetic region being provided with a free second magnetic moment vector which is switchable between a same and an opposite direction with respect to the fixed first magnetic moment vector of the first magnetic region;
a second stacked structure arranged at least partly in a lateral relationship to the first stacked structure and comprising a third magnetic region being provided with a fixed third magnetic moment vector and the second magnetic region; and at least two electrodes, wherein the first and second structures are arranged between, and are in electrical contact with, the at least two electrodes;

applying a writing voltage pulse resulting in a writing current pulse flowing through the second magnetic region for switching of its free magnetic moment vector to electrodes on both sides of only the second stacked structure; and applying a reading voltage pulse resulting in a reading current pulse flowing through the magnetic tunnel junction to electrodes on both sides of only the first stacked structure.

11. The method of claim 10, wherein the writing voltage pulse is applied so as to produce a coherent rotation over half a full turn of the free second magnetic moment vector in total.

12. The method of claim 10, wherein the polarity of the writing voltage pulse is applied so as to produce a parallel or antiparallel alignment of the magnetization direction of the first and second magnetic regions.

13. The method of claim 10, wherein the fixed magnetic moment vector of the third magnetic region is perpendicularly aligned with respect to the free magnetic moment vector of the second magnetic region.

14. The method of claim 10, wherein one of the at least two electrodes is arranged on one side of the first and second stacked structures and is a common electrode connecting the first and second stacked structures.

15. The method of claim 14, wherein the common electrode is positioned adjacent the second magnetic region.

16. The method of claim 15, wherein the at least two electrodes includes separate electrodes for each of the first and second stacked structures, the separate electrodes being respectively arranged on the first and second stacked structures on a side opposite the common electrode.

17. The method of claim 10, wherein the at least two electrodes includes first and second electrodes disposed on opposite sides of the first stacked structure, and third and fourth electrodes disposed on opposite sides of the second stacked structure, the third and fourth electrodes being separate from the first and second electrodes.

18. The method of claim 10, wherein the first magnetic moment vector of the first magnetic region is aligned parallel with respect to the second magnetic moment vector of the second magnetic region.

19. The method of claim 18, wherein the fixed magnetic moment vector of the third magnetic region is aligned in parallel to the free magnetic moment vector of the second magnetic region.

20. The method of claim 19, wherein the first, second and third magnetic moment vectors are perpendicularly aligned with respect to bottom surfaces of said first and second stacked structures.

21. The method of claim 20, wherein the separating layer comprises ruthenium (Ru).

22. The method of claim 10, wherein the first magnetic region comprises a first ferromagnetic layer, a separating layer, a second ferromagnetic layer and an antiferromagnetic layer.

23. A method of writing to and reading from a magnetoresistive hybrid memory cell, the method comprising:

providing a magnetoresistive hybrid memory cell comprising:

a first stacked structure comprising a magnetic tunnel junction including first and second magnetic regions stacked in a parallel, overlying relationship separated by a layer of non-magnetic material, wherein the first magnetic region being provided with a fixed first magnetic moment vector and the second magnetic region being provided with a free second magnetic moment vector which is switchable between a same and an opposite direction with respect to the fixed first magnetic moment vector of the first magnetic region;

a second stacked structure arranged at least partly in a lateral relationship to the first stacked structure and comprising a third magnetic region having a fixed third magnetic moment vector and the second magnetic region; and at least two electrodes, wherein the first and second structures are arranged between, and are in electrical contact with the at least two electrodes;

applying a writing voltage pulse resulting in a writing current pulse flowing through the second magnetic region for switching of its free magnetic moment vector to electrodes on both sides of only the second stacked structure, wherein the switching voltage pulse is applied so as to produce a coherent rotation over half a full turn of the free second magnetic moment vector in total, the switching time being provided with a slow rise time and a fast fall time; and applying a reading voltage pulse resulting in a reading current pulse flowing through the magnetic tunnel junction to electrodes on both sides of only the first stacked structure.

24. The method of claim 23, wherein the first magnetic moment vector of the first magnetic region is aligned parallel with respect to the second magnetic moment vector of the second magnetic region.

25. The method of claim 24, wherein the fixed magnetic moment vector of the third magnetic region is aligned in parallel to the free magnetic moment vector of the second magnetic region.

* * * * *